United States Patent [19]

Hakala

[11] Patent Number: 4,469,563

[45] Date of Patent: Sep. 4, 1984

[54] PROCESS FOR TREATING HIGH-DENSITY INFORMATION DISC RECORDING SUBSTRATES

[75] Inventor: David F. Hakala, Indianapolis, Ind.

[73] Assignee: RCA Corporation, New York, N.Y.

[21] Appl. No.: 525,477

[22] Filed: Aug. 22, 1983

[51] Int. Cl.³ .......................... C25D 1/10; C25D 5/34
[52] U.S. Cl. ...................................... 204/5; 204/32.1; 204/38 B
[58] Field of Search .............. 204/5, 3, 4, 32 R, 38 R, 204/38 B

[56] References Cited

U.S. PATENT DOCUMENTS 4,305,791  12/1981  Whitehurst .............................. 204/5

Primary Examiner—Thomas Tufariello
Attorney, Agent, or Firm—Birgit E. Morris; Edward J. Sites

[57] ABSTRACT

Copper recording substrates for high-density information discs are first passivated in an alkaline oxidizing bath and then the surface oxide layer formed thereby is removed in ammonium chloride solution. This treatment improves the adhesion of a subsequently applied thin layer of chromium which protects the recording substrate during subsequent plating steps.

6 Claims, No Drawings

PROCESS FOR TREATING HIGH-DENSITY INFORMATION DISC RECORDING SUBSTRATES

This invention relates to an improved method of manufacturing recording substrates for a high-density information disc.

BACKGROUND OF THE INVENTION

High-density information discs are now commercially available with recorded video, audio and color information which can be played back through a standard television monitor. The density of the information recorded is such that the record can play up to one hour or even longer on each side while spinning at very high speeds of 450 rpm or higher. It will be appreciated that the size of the information bits recorded in the surface is very small, orders of magnitude smaller than are required for audio discs for example, which play back for about 15 minutes at 33 rpm.

In the manufacture of audio records, the audio information is first cut into a lacquer surface. This surface is then replicated by depositing a conductive layer, e.g., silver, on the lacquer and plating nickel over it, thus forming a self-sustaining negative part known as a master. One or more masters can be pulled from a single recorded substrate. The master can itself be replicated in turn to form a positive part known as the mother and finally, by a similar process, a negative metal stamper is plated onto the mother. This stamper is used in a molding press to mold plastic discs having the information pressed into the surface. This general scheme is also followed in the manufacture of high-density information discs, except that because of the size and density of the information bits, the original cutting is done in a finely grained electro-deposited bright acid copper substrate.

U.S. Pat. No. 4,305,791, herein incorporated by reference, describes a cleaning and passivating procedure for preparation of the copper substrate for subsequent nickel plating to form the master. The surface of the copper must be cleaned of all debris and grease prior to replication, and its surface must also be passivated to ensure that the nickel master can be completely parted from the copper with a minimum of damage to the master or the recording substrate. The preferred passivating procedure described includes a degreasing step using organic solvents, followed by a passivation step whereby the copper substrate is immersed in an alkaline cleaner, such as trisodium phosphate, and an oxidizing agent, such as potassium dichromate.

In an effort to improve the number of masters that can be plated onto a single copper recording substrate, it has been suggested by Gorog and Fox in co-pending application Ser. No. 348,677 filed Feb. 16, 1982, now U.S. Pat No. 4,402,798 also herein incorporated by reference, that a very thin layer of chromium or chromium oxide be applied to the surface to harden and protect the copper. A layer about 200-400 angstroms thick can be deposited on the copper by vacuum evaporation, chemical vapor deposition, or most preferably, by sputtering.

However, the chromium-containing layer does not adhere well to the copper surface which has been passivated by the above-described method, and thus the substrate and master may be damaged when the parts are separated.

SUMMARY OF THE INVENTION

I have found that an ammonium chloride rinse following the surface passivation of copper substrates greatly improves the adhesion of sputtered chromium on the copper substrate, thus improving the replication process.

DETAILED DESCRIPTION OF THE INVENTION

After an information pattern has been cut into a copper substrate, the substrate surface is first cleaned to remove organic oils and the like. Suitable solvents include one or more of methylene chloride, tetrahydrofuran, acetone and the like.

After cleaning, the surface is next passivated in a solution containing an alkaline cleaner and an oxidizing agent. Suitable alkaline cleaners include trisodium phosphate, tetrasodium pyrophosphate and the like. Commercial solutions are available, which usually also contain wetting agents and chelating agents in addition to the alkaline salt. A product of Enthone, Inc. available as Enbond NS-35 is suitable. Suitable oxidizing agents include potassium or sodium dichromate, potassium or sodium permanganate and the like. The passivating solution should suitably contain about 5-30 grams per liter of the alkaline salt and about 2.5-20 grams per liter of the oxidizing agent. The passivation is carried out at an elevated temperature of between 35°-85° C., preferably about 55° C. Suitably the copper substrate is immersed in this solution for about 5 to 30 minutes.

The above solution cleans the copper surface of inorganic impurities and also puts down a thin copper oxide layer on the surface. It is believed that it is this thin oxide layer that prevents the adhesion of a subsequently applied chromium layer onto the copper.

Thus after rising the part with pure deionized water, the oxide layer is removed with ammonium chloride solution. The ammonium chloride solution should contain from about 2-15 percent by weight of the salt in water. If the concentration of ammonium chloride is too low, the oxide will not be removed. If the concentration is too high, the solution will not be rinsed off properly, with consequent problems during subsequent processing. The immersion time is not critical, but in general can be from about 0.5 to 5 minutes.

The ammonium chloride is then removed with a deionized water rinse and the part is dried with one or more organic solvents. In a presently preferred process, the part can be dried partially with an alcohol such as isopropyl alcohol, which removes the bulk of the water, and the final drying carried out either using 1,1,2-trichloro-2,2,1-trifluoroethane or by spin-drying in air.

The invention will be further illustrated by the following Example but the invention is not meant to be limited to the details described therein. In the Example all parts and percentages are by weight unless otherwise noted.

EXAMPLE 1

A copper substrate into which audio, video and color information had been cut was degreased by immersing in methylene chloride.

The part was next immersed in a solution containing 15 grams per liter of potassium dichromate and 30 grams per liter of Enbond NS-35 at 55° C. for 10 minutes.

The part was spray-rinsed with deionized water and immersed for one minute in a 5 percent solution of ammonium chloride, followed by another deionized water rinse.

The part was dried first by spraying with isopropyl alcohol and then with 1,1,2-trichloro-2,2,1-trifluoroethane.

I claim:

1. In a method for treating a copper recording substrate which comprises immersing said substrate in an aqueous solution of about 5-30 grams per liter of an alkaline cleaner and from about 2.5-20 grams per liter of an oxidizing agent, said mixture being maintained at between about 35°-85° C., for an immersion time between about 5-30 minutes, the improvement which comprises removing the copper oxide layer formed thereby by immersing in an ammonium chloride aqueous solution.

2. A method according to claim 1 wherein the concentration of the ammonium chloride in the solution is from about 2-15 percent by weight.

3. A method according to claim 1 wherein the concentration of ammonium chloride is about 5 percent by weight and the substrate is immersed therein for from about 0.5 to 5 minutes.

4. A method according to claim 1 wherein the substrate is subsequently dried with one or more organic solvents.

5. A method according to claim 4 wherein the substrate is first treated with an alcohol and then with 1,1,2-trichloro-2,2,1-trifluoroethane.

6. A method according to claim 4 wherein the substrate is first treated with an alcohol and then dried in air.

* * * * *